United States Patent
Park et al.

(10) Patent No.: US 12,031,077 B2
(45) Date of Patent: Jul. 9, 2024

(54) ETCHING COMPOSITION FOR METAL NITRIDE LAYER AND ETCHING METHOD USING THE SAME

(71) Applicant: ENF TECHNOLOGY CO., LTD., Yongin-si (KR)

(72) Inventors: Hyeon Woo Park, Yongin-si (KR); Seok Hyeon Nam, Yongin-si (KR); Myung Ho Lee, Yongin-si (KR); Myung Geun Song, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 0 days.

(21) Appl. No.: 17/805,332

(22) Filed: Jun. 3, 2022

(65) Prior Publication Data

US 2022/0396733 A1    Dec. 15, 2022

(30) Foreign Application Priority Data

Jun. 4, 2021 (KR) .................. 10-2021-0072799

(51) Int. Cl.

| | |
|---|---|
| C09K 13/10 | (2006.01) |
| C09K 13/00 | (2006.01) |
| C09K 13/04 | (2006.01) |
| C23F 1/00 | (2006.01) |
| C23F 1/14 | (2006.01) |
| C23F 1/16 | (2006.01) |
| C23F 1/44 | (2006.01) |
| H01L 21/306 | (2006.01) |
| H01L 21/3213 | (2006.01) |

(52) U.S. Cl.
CPC .............. *C09K 13/10* (2013.01); *C09K 13/00* (2013.01); *C09K 13/04* (2013.01); *C23F 1/00* (2013.01); *C23F 1/14* (2013.01); *C23F 1/16* (2013.01); *C23F 1/44* (2013.01); *H01L 21/30604* (2013.01); *H01L 21/32134* (2013.01)

(58) Field of Classification Search
None
See application file for complete search history.

(56) References Cited

U.S. PATENT DOCUMENTS

| | | | | |
|---|---|---|---|---|
| 9,831,088 | B2* | 11/2017 | Chen | H01L 21/32134 |
| 2010/0267225 | A1* | 10/2010 | Lee | H01L 21/02071 |
| | | | | 257/E21.334 |
| 2016/0257880 | A1* | 9/2016 | Hong | H01L 21/32134 |

FOREIGN PATENT DOCUMENTS

CN          108018556      *  5/2018   ................ C23F 1/18

* cited by examiner

*Primary Examiner* — Jiong-Ping Lu
(74) *Attorney, Agent, or Firm* — McCoy Russell LLP

(57) ABSTRACT

The present disclosure provides an etching composition for a metal nitride layer and an etching method of a metal nitride layer using the same, and more particularly, to an etching composition for a metal nitride layer selectively etching the metal nitride layer, an etching method of a metal nitride layer using the etching composition, and a method of manufacturing a microelectronic device, the method including an etching process performed using the etching composition.

9 Claims, No Drawings

ETCHING COMPOSITION FOR METAL NITRIDE LAYER AND ETCHING METHOD USING THE SAME

CROSS-REFERENCE TO RELATED APPLICATION

The present application claims priority to Korean Patent Application No. 10-2021-0072799 filed on Jun. 4, 2021. The entire contents of the above-listed application are hereby incorporated by reference for all purposes.

TECHNICAL FIELD

The following disclosure relates to an etching composition for a metal nitride layer and an etching method using the same, and more particularly, to an etching composition for a metal nitride layer, a method of selectively etching a metal nitride layer using the etching composition, and a method of manufacturing a microelectronic device, the method including an etching process performed using the etching composition.

BACKGROUND

In recent years, the semiconductor industry has been developed into an ultra-fine technology for implementing a pattern with a size of several nanometers to several tens of nanometers, and an effective lithography method is required to realize such an ultra-fine technology.

In general, the lithography method includes: forming a material layer on a semiconductor substrate; coating a photoresist layer on the material layer; exposing and developing the photoresist layer to form a photoresist pattern, and etching the material layer using the photoresist pattern as a mask.

However, as a size of a pattern to be formed is reduced, it is difficult to form a fine pattern having an excellent profile only by a general lithography method. Therefore, a fine pattern may be formed by forming a layer called a "hardmask" between the material layer to be etched and the photoresist layer. The hardmask acts as an interlayer that transfers the fine pattern of the photoresist layer to the material layer through a selective etching process.

In general, a titanium-based metal such as titanium or titanium nitride has been used for the hardmask. The hardmask is removed by a wet-etching process after a via and/or trench having a dual damascene is formed.

Therefore, it is required to perform a wet-etching process that is an etching process of effectively removing a metal hardmask and/or a photoresist etching residue without affecting a metal conductor layer and a low dielectric material of a base layer.

In particular, the etching process is very important because it is required to increase an etching degree of a metal nitride layer while suppressing an etching degree of a metal layer containing a metal or a metal alloy according to manufacturing characteristics of a device.

The wet-etching process is an etching method using an etchant composition that is a liquid having a property of corroding and dissolving only a target metal, in which an etchant composition mainly containing hydrogen peroxide is used.

However, decomposition of the hydrogen peroxide is generated due to instability of the hydrogen peroxide, and an etching amount of the metal layer containing a metal cannot be controlled due to insufficient etch selectivity of the metal nitride layer or the like. Thus, there is still a problem in securing an etch selectivity.

SUMMARY

An embodiment of the present disclosure is directed to providing an etching composition for a metal nitride layer and an etching method using the same.

Another embodiment of the present disclosure is directed to providing a method of manufacturing a microelectronic device, the method including an etching process performed using the etching composition for a metal nitride layer of the present disclosure.

An object of the present disclosure is to provide an etching composition for a metal nitride layer having improved storage stability and etch selectivity.

In one general aspect, an etching composition for a metal nitride layer contains sulfuric acid, hydrogen peroxide, a boron-based compound, and water, wherein the boron-based compound is contained in an amount of 0.0001 to 3 wt % with respect to a total weight of the etching composition.

The boron-based compound according to an exemplary embodiment of the present disclosure may be a compound containing one or more selected from a B—O bond, a B—O—O bond, and a B=O bond, and may be contained in an amount of 0.001 to 10 parts by weight with respect to 100 parts by weight of the hydrogen peroxide.

The boron-based compound according to an exemplary embodiment of the present disclosure may be one or more selected from boron trioxide, borate, triphenylboroxin, and a boron compound represented by the following Chemical Formula 1:

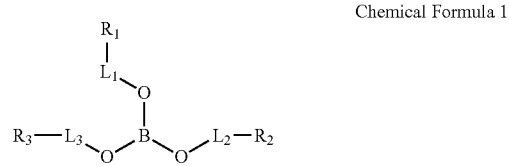

Chemical Formula 1 wherein $L_1$ to $L_3$ are each independently a single bond or $C_1$-$C_{10}$ alkylene; and $R_1$ to $R_3$ are each independently hydrogen, $C_1$-$C_{10}$ alkyl, $C_1$-$C_{10}$ haloalkyl, $C_6$-$C_{10}$ aryl, mono-$C_1$-$C_{10}$ alkylamino, di-$C_1$-$C_{10}$ alkylamino, mono-$C_6$-$C_{10}$ arylamino, or di-$C_6$-$C_{10}$ arylamino.

The etching composition according to an exemplary embodiment of the present disclosure may contain 75 to 95 wt % of sulfuric acid, 1 to 12 wt % of hydrogen peroxide, 0.0001 to 1 wt % of a boron-based compound, and a balance of water.

The etching composition according to an exemplary embodiment of the present disclosure may further contain one or two or more additional additives selected from an etching stabilizer, a fluorine-based compound, a glycol-based compound, and a pH adjuster.

The metal nitride layer according to an exemplary embodiment of the present disclosure may be one or more selected from a titanium nitride layer, a tantalum nitride layer, and a titanium-tantalum nitride layer, and for example, may be obtained by laminating metal layers formed of one or two or more selected from tungsten, copper, molybdenum, titanium, indium, zinc, tin, and niobium.

Another object of the present disclosure is to provide an etching method of a metal nitride layer using the etching composition for a metal nitride layer of the present disclosure.

In another general aspect, an etching method of a metal nitride layer includes: bringing the etching composition for a metal nitride layer of the present disclosure into contact with a microelectronic device including a metal nitride layer and a metal layer to selectively etch the metal nitride layer from the microelectronic device.

In the etching method according to an exemplary embodiment of the present disclosure, the metal nitride layer may be one or two or more selected from a titanium nitride layer, a tantalum nitride layer, and a titanium-tantalum nitride layer, and the metal layer may be formed of one or two or more selected from tungsten, copper, molybdenum, titanium, indium, zinc, tin, and niobium.

In still another general aspect, there is provided a method of manufacturing a microelectronic device, the method including an etching process performed using the etching composition for a metal nitride layer of the present disclosure.

DETAILED DESCRIPTION

Hereinafter, the etching composition for a metal nitride layer and the etching method using the same according to the present disclosure will be described in detail. Here, technical terms and scientific terms used in the present specification have the general meaning understood by those skilled in the art to which the present disclosure pertains unless otherwise defined, and a description for the known function and configuration which may unnecessarily obscure the gist of the present disclosure will be omitted in the following description.

The singular form used in the present specification may be intended to also include a plural form, unless otherwise indicated in the context.

In addition, units used in the present specification without particular mention are based on weights, and as an example, a unit of % or ratio refers to a wt % or a weight ratio and wt % refers to wt % of any one component in a total composition, unless otherwise defined.

In addition, the numerical range used in the present specification includes all values within the range including the lower limit and the upper limit, increments logically derived in a form and span in a defined range, all double limited values, and all possible combinations of the upper limit and the lower limit in the numerical range defined in different forms. Unless otherwise defined in the specification of the present disclosure, values which may be outside a numerical range due to experimental error or rounding of a value are also included in the defined numerical range.

The term of the present specification "comprise" is an open-ended description having a meaning equivalent to the term such as "is/are provided", "contain", "have", or "is/are characterized", and does not exclude elements, materials or processes which are not further listed.

The term "microelectronic device" described in the present specification corresponds to a semiconductor substrate, a flat panel display device, a phase change memory device, a solar panel, a solar cell device, a photovoltaic, and other products including a microelectromechanical system (MEMS) manufactured in order to be used for microelectronics, an integrated circuit, an energy set, or a computer chip application. It is to be understood that the terms "microelectronic device", "microelectronic substrate", and "microelectronic device structure" are not meant to be limiting in any way and include any substrate or structure that will eventually become a microelectronic device or a microelectronic assembly. The microelectronic device may be patterned or blanketed, and may be a control and/or a test device.

The term "hardmask" described in the specification of the present disclosure corresponds to a material deposited on a dielectric material to be protected during a plasma etching process. A hardmask layer is typically formed of silicon nitride, silicon oxynitride, titanium nitride, titanium oxynitride, titanium, and other similar compounds.

The term "metal nitride layer" described in the specification of the present disclosure is a layer in which a pure or impure metal and nitrogen with various stoichiometries are included by physical bonding, chemical bonding, and the like. As a specific example, a "titanium nitride layer" and "TiNx" include both pure titanium nitride and oxygen-containing materials (TiOxNy) as well as impure titanium nitride with various stoichiometries. A metal nitride layer described in the specification of the present disclosure may be used as a barrier layer or a hardmask when manufacturing a microelectronic device such as a circuit wiring of a MEMS, a display device, and a semiconductor device.

The term "metal" described in the specification of the present disclosure includes a transition metal and a non-metal as well as an alkali metal and an alkaline earth metal.

The term "alkyl" described in the specification of the present disclosure refers to a saturated linear or branched hydrocarbon chain radical consisting of only carbon and hydrogen atoms and attached to the remaining portion of a molecule by a single bond. An alkyl group of the present disclosure may be alkyl having 1 to 3 carbon atoms ($C_1$-$C_3$ alkyl), and specific examples thereof include methyl, ethyl, n-propyl, and 1-methylethyl (iso-propyl).

The term "halogen" or "halo" described in the present specification refers to fluorine, chlorine, bromine, or iodine.

The term "haloalkyl" described in the specification of the present disclosure refers to an alkyl, alkoxy, alkenyl, or alkynyl group in which one or more hydrogen atoms are substituted with halogen atoms. For example, haloalkyl includes —$CF_3$, —$CHF_2$, —$CH_2F$, —$CBr_3$, —$CHBr_2$, —$CH_2Br$, —$CCl_3$, —$CHCl_2$, —$CH_2Cl$, —$CI_3$, —$CHI_2$, —$CH_2I$, —$CH_2$—$CF_3$, —$CH_2$—$CHF_2$, —$CH_2$—$CH_2F$, —$CH_2$—$CBr_3$, —$CH_2$—$CHBr_2$, —$CH_2$—$CH_2Br$, —$CH_2$—$CCl_3$, —$CH_2$—$CHCl_2$, —$CH_2$—$CH_2Cl$, —$CH_2$—$CI_3$, —$CH_2$—$CHI_2$, —$CH_2$—$CH_2I$, and the like, in which alkyl and halogen are as defined above.

The term "mono-alkylamino" described in the specification of the present disclosure refers to —NH(alkyl) including —$NHCH_3$, —$NHCH_2CH_3$, —$NH(CH_2)_2CH_3$, —$NH(CH_2)_3CH_3$, —$NH(CH_2)_4CH_3$, —$NH(CH_2)_5CH_3$, and the like, in which alkyl is as defined above.

The "di-alkylamino" described in the present specification refers to —N(alkyl)(alkyl) including —$N(CH_3)_2$, —$N(CH_2CH_3)_2$, —$N((CH_2)_2CH_3)_2$, —$N(CH_3)(CH_2CH_3)$, and the like, in which each alkyl is independently alkyl as defined above.

The term "aryl" described in the specification of the present disclosure refers to a hydrocarbon ring-based radical containing hydrogen, carbon atoms, and at least one aromatic ring. As an example, aryl is a hydrocarbon ring-based radical containing hydrogen, 6 to 12 carbon atoms, and at least one aromatic ring; a hydrocarbon ring-based radical containing 6 to 9 carbon atoms and at least one aromatic ring; and a hydrocarbon ring-based radical containing hydrogen, 9 to 12 carbon atoms, and at least one aromatic ring.

The term "aryl radical" described in the specification of the present disclosure may be a monocyclic, bicyclic, tricyclic, or tetracyclic ring-based radical which may include a fused or crosslinked ring-based radical. The aryl radical includes, but is not limited to, an aryl radical derived from benzene, biphenyl, indane, indene, and naphthalene.

The terms "mono-arylamino" and "di-arylamino" described in the specification of the present disclosure are obtained by substituting one or two H's of an amino group with aryl as in mono-alkylamino and di-alkylamino, in which aryl is as defined above.

The present disclosure provides an etching composition for a metal nitride layer having significantly excellent etch rate, etch selectivity, and storage stability. The etching composition for a metal nitride layer of the present disclosure contains sulfuric acid, hydrogen peroxide, a boron-based compound, and water, and the boron-based compound is contained in an amount of 0.0001 to 3 wt % with respect to the total weight of the etching composition.

The etching composition for a metal nitride layer of the present disclosure contains a boron-based compound as an additive, such that a metal nitride layer used as a hardmask or the like may be etched at an excellent selectivity, and decomposition of the hydrogen peroxide may be suppressed. Therefore, etching performance is not reduced even after long-term storage.

That is, the etching composition for a metal nitride layer of the present disclosure may selectively etch the metal nitride layer while maintaining an etch rate and effectively controlling an etch rate of a metal layer, such that corrosion of a metal wiring layer and a liner layer is prevented, and decomposition of the hydrogen peroxide is prevented. Therefore, the etching composition has significantly excellent storage stability.

As the boron-based compound according to an exemplary embodiment of the present disclosure, any boron-based compound may be used as long as it is a compound containing a bond of boron and oxygen. The boron-based compound may be a compound containing one or more bonds selected from a B—O bond, a B—O—O bond, and a B=O bond, and for instance, may be a compound containing a B—O bond, a B—O—O bond, or both of these bonds.

Specifically, the boron-based compound according to an exemplary embodiment of the present disclosure may be, but is not limited to, one or more selected from boron trioxide, borate, triphenylboroxin, and a boron compound represented by the following Chemical Formula 1:

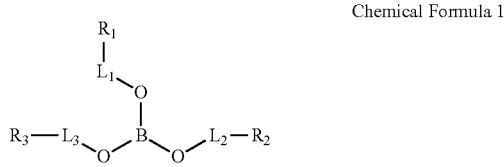

Chemical Formula 1 wherein
L$_1$ to L$_3$ are each independently a single bond or C$_1$-C$_{10}$ alkylene; and
R$_1$ to R$_3$ are each independently hydrogen, C$_1$-C$_{10}$ alkyl, C$_1$-C$_{10}$ haloalkyl, C$_6$-C$_{10}$ aryl, mono-C$_1$-C$_{10}$ alkylamino, di-C$_1$-C$_{10}$ alkylamino, mono-C$_6$-C$_{10}$ arylamino, or di-C$_6$-C$_{10}$ arylamino.

In a case of an etching composition for a metal nitride layer containing hydrogen peroxide according to the related art, the hydrogen peroxide is decomposed over time after preparation, and etching properties are remarkably deteriorated, which causes the inconvenience of having to prepare the etching composition every time when used.

However, the etching composition for a metal nitride layer of the present disclosure contains a boron-based compound, such that storage stability of hydrogen peroxide is significantly excellent, and etching properties may be maintained for a long period of time.

In terms of implementing more excellent etch rate and etch selectivity, the boron-based compound may be borate or a boron compound represented by Chemical Formula 1. In Chemical Formula 1, L$_1$ to L$_3$ may be each independently a single bond or C$_1$-C$_5$ alkylene; and R$_1$ to R$_3$ may be each independently hydrogen, C$_1$-C$_5$ alkyl, C$_1$-C$_5$ haloalkyl, mono-C$_1$-C$_5$ alkylamino, or di-C$_1$-C$_5$ alkylamino, and L$_1$ to L$_3$ may be each independently a single bond or C$_1$-C$_3$ alkylene; and R$_1$ to R$_3$ may be each independently hydrogen, C$_1$-C$_5$ haloalkyl, or di-C$_1$-C$_5$ alkylamino.

Examples of the borate according to an exemplary embodiment of the present disclosure include a compound containing ammonium borate, an alkali metal and boron, or an alkaline earth metal and boron, and a hydrate thereof. As a specific example, the borate may be one or more selected from sodium borate, sodium perborate tetrahydrate, magnesium perborate, and ammonium borate.

The etching composition for a metal nitride layer of the present disclosure contains a boron-based compound, such that the etching composition has significantly improved etching properties in comparison to conventional persulfate or the like known to have excellent etch rate and etch selectivity.

The boron-based compound according to an exemplary embodiment of the present disclosure may be contained in an amount of 0.001 to 10 parts by weight, such as 0.005 to 7 parts by weight, or 0.01 to 7 parts by weight, with respect to 100 parts by weight of the hydrogen peroxide.

The etching composition according to an exemplary embodiment of the present disclosure may contain 75 to 95 wt % of sulfuric acid, 1 to 12 wt % of hydrogen peroxide, 0.0001 to 1 wt % of a boron-based compound, and a balance of water, may contain 80 to 90 wt % of sulfuric acid, 1 to 8 wt % of hydrogen peroxide, 0.001 to 0.4 wt % of a boron-based compound, and a balance of water, and may also contain 80 to 90 wt % of sulfuric acid, 1 to 5 wt % of hydrogen peroxide, 0.005 to 0.3 wt % of a boron-based compound, and a balance of water.

In the etching composition for a metal nitride layer according to an exemplary embodiment of the present disclosure, the content of each of the hydrogen peroxide and the boron-based compound is adjusted, such that an etch selectivity may be controlled, and a more excellent etch selectivity may be implemented when the content of each component is in the above range.

The etching composition for a metal nitride layer according to an exemplary embodiment of the present disclosure may further contain a known additive within a range recognized by those skilled in the art.

As an example, the etching composition for a metal nitride layer according to an exemplary embodiment of the present disclosure may further contain one or two or more additional additives selected from an etching stabilizer, a fluorine-based compound, a glycol-based compound, and a pH adjuster.

The etching composition for a metal nitride layer according to an exemplary embodiment of the present disclosure contains a combination of hydrogen peroxide and a boron-based compound, such that the etching composition has more improved etching properties for the metal nitride layer.

The metal nitride layer according to an exemplary embodiment of the present disclosure may be one or more selected from a titanium nitride layer, a tantalum nitride layer, and a titanium-tantalum nitride layer, and for example, may be a titanium nitride layer.

The metal of the metal nitride layer according to an exemplary embodiment of the present disclosure may be one or two or more selected from tungsten, copper, molybdenum, titanium, indium, zinc, tin, and niobium, and for instance, may be one or two or more selected from tungsten, copper, and titanium.

In addition, the present disclosure provides an etching method of a metal nitride layer using the etching composition for a metal nitride layer of the present disclosure.

The etching method of a metal nitride layer includes: bringing the etching composition for a metal nitride layer of the present disclosure into contact with a microelectronic device including a metal nitride layer and a metal layer to selectively etch the metal nitride layer from the microelectronic device.

The etching method of the metal layer using the etching composition for a metal nitride layer of the present disclosure may be performed by a general method.

In addition, the present disclosure provides a method of manufacturing a microelectronic device, the method including an etching process performed using the etching composition for a metal nitride layer of the present disclosure.

Hereinafter, the present disclosure will be described in detail with reference to Examples. However, the following Examples illustrate only the present disclosure, and the description of the present disclosure is not limited by the following Examples.

Examples 1 to 9 and Comparative Examples 1 to 6

The respective components were mixed with the component contents shown in Table 1 to prepare etching compositions of Examples 1 to 9 and Comparative Examples 1 to 6 according to the present disclosure.

Specifically, the components were mixed at the ratios shown in Table 1, and the mixture was stirred at room temperature (20° C.) for 30 minutes, thereby preparing etching compositions.

TABLE 1

| Classification | Hydrogen peroxide composition content (%) | | | | Sulfuric acid:Hydrogen peroxide composition (weight ratio) |
|---|---|---|---|---|---|
| | Hydrogen peroxide (wt %) | Additive | | Ultra-pure water | |
| | | Boron-based compound | Content (wt %) | | |
| Example 1 | 31.05 | Boric acid | 0.05 | Balance | 88:12 |
| Example 2 | 31.0 | Boric acid | 0.1 | Balance | 88:12 |
| Example 3 | 30.8 | Boric acid | 0.3 | Balance | 88:12 |
| Example 4 | 30.1 | Boric acid | 1.0 | Balance | 88:12 |
| Example 5 | 30.8 | Sodium perborate tetrahydrate | 0.3 | Balance | 88:12 |
| Example 6 | 30.8 | Magnesium perborate($B_2MgO_6$) | 0.3 | Balance | 88:12 |
| Example 7 | 30.8 | Triphenylboroxin | 0.3 | Balance | 88:12 |
| Example 8 | 30.8 | Tris[2-(dimethylamino)ethyl]borate | 0.3 | Balance | 88:12 |
| Example 9 | 30.8 | Tris(hexafluoroisopropyl)borate | 0.3 | Balance | 88:12 |
| Comparative Example 1 | 31.1 | — | — | Balance | 88:12 |
| Comparative Example 2 | 30.95 | Ammonium sulfate | 0.15 | Balance | 88:12 |
| Comparative Example 3 | 29.6 | Ammonium sulfate | 1.5 | Balance | 88:12 |
| Comparative Example 4 | 30.8 | Citric acid | 0.3 | Balance | 88:12 |
| Comparative Example 5 | 30.8 | Ammonium persulfate | 0.3 | Balance | 88:12 |
| Comparative Example 6 | 30.8 | Peracetic acid | 0.3 | Balance | 88:12 |

In the etching method according to an exemplary embodiment of the present disclosure, the metal nitride layer may be one or two or more selected from a titanium nitride layer, a tantalum nitride layer, and a titanium-tantalum nitride layer. The metal nitride layer of the present disclosure may be a titanium nitride layer.

The metal layer may be formed of a metal used for a wiring. The metal is not limited, but may be copper, cobalt, tungsten, or the like, and for example, may be tungsten.

Therefore, the etching method according to an exemplary embodiment of the present disclosure may be applied to a titanium nitride layer and/or a tungsten layer.

Experimental Example 1: Measurement of Etch Rates of Titanium Nitride Layer and Tungsten Layer In order to confirm the etching performance of each of the etching compositions prepared in Examples and Comparative Examples, a wafer in which a titanium nitride layer was deposited on a tungsten layer was prepared by performing deposition in the same manner as that of a semiconductor manufacturing process using chemical vapor deposition (CVD) and physical vapor deposition (PVD) methods.

Before starting etching, a thickness before etching was measured using an ellipsometer (M-2000U, manufactured by J. A WOOLLAM) as a thin film thickness measurement apparatus. The etching process was performed by placing each of the etching compositions for a metal nitride layer prepared in Examples 1 to 9 and Comparative Examples 1 to 6 in a double jacketed beaker maintained at 90° C., stirring the etching composition at 300 rpm for 10 minutes, and immersing each wafer in the etching composition for 1 minute. After the etching was completed, the wafer was washed with ultra-pure water, and a residual etchant and moisture were completely dried using nitrogen gas.

In this case, the etch rate was calculated from a difference between thicknesses before and after etching using the ellipsometer (M-2000U, manufactured by J. A WOOLLAM). The results thereof are shown in Table 2.

TABLE 2

| Classification | Etching performance (immediately after preparation) | | | Etching performance (storage for 3 months) | | |
|---|---|---|---|---|---|---|
| | TiN ER (Å/min) | W ER (Å/min) | Selectivity | TiN ER (Å/min) | W ER (Å/min) | Selectivity |
| Example 1 | 122.4 | 35.1 | 3.5 | 121.9 | 35.3 | 3.5 |
| Example 2 | 121.5 | 30.9 | 3.9 | 122.1 | 30.8 | 4.0 |
| Example 3 | 122.0 | 25.2 | 4.8 | 121.5 | 24.8 | 4.9 |
| Example 4 | 121.6 | 20.5 | 5.9 | 121.4 | 20.7 | 5.9 |
| Example 5 | 120.3 | 28.1 | 4.3 | 120.2 | 28.0 | 4.3 |
| Example 6 | 121.2 | 31.2 | 3.9 | 122.2 | 30.9 | 4.0 |
| Example 7 | 120.6 | 29.4 | 4.1 | 121.0 | 29.6 | 4.1 |
| Example 8 | 120.9 | 27.3 | 4.4 | 120.8 | 27.8 | 4.3 |
| Example 9 | 119.5 | 29.1 | 4.1 | 120.1 | 28.5 | 4.2 |
| Comparative Example 1 | 124.2 | 59.3 | 2.1 | 99.5 | 52.9 | 1.9 |
| Comparative Example 2 | 121.3 | 57.2 | 2.1 | 111.1 | 55.5 | 2.0 |
| Comparative Example 3 | 121.0 | 58.3 | 2.1 | 108.6 | 56.6 | 1.9 |
| Comparative Example 4 | 120.6 | 52.6 | 2.3 | 100.9 | 50.2 | 2.0 |
| Comparative Example 5 | 121.3 | 39.2 | 3.1 | 111.5 | 37.6 | 3.0 |
| Comparative Example 6 | 121.5 | 38.4 | 3.2 | 111.0 | 36.1 | 3.1 |

As shown in Table 2, it may be appreciated that the etching composition for a metal nitride layer of the present disclosure contains a boron-based compound, such that the etching composition has an improved etch selectivity in comparison to Comparative Examples in which the boron-based compound is not contained, or the sulfate compound and the organic acid are contained as additives.

In particular, the boron-based compound of the present disclosure contains a boron-oxygen bond, such that the long-term storage stability is excellent. Thus, it may be appreciated that the etching performance and the etch selectivity are maintained even after storage for 3 months or longer.

Furthermore, the etching composition of the present disclosure has a significantly improved etch selectivity by controlling only an etch rate of W without a reduction in etch rate of TiN even at a high temperature (85° C. or higher).

In addition, based on the treatment at a high temperature, unlike the additive according to the related art, the content of the boron-based compound of the present disclosure, specifically, the compound containing a boron-oxygen bond is simply adjusted, such that a more improved etch selectivity may be implemented, and the performance is not deteriorated even when the etching composition is stored for 3 months or longer.

As set forth above, the etching composition for a metal nitride layer of the present disclosure may efficiently control an etch rate of the metal layer and may selectively etch the metal nitride layer.

Further, the etching composition for a metal nitride layer of the present disclosure contains a boron-based compound, such that hydrogen peroxide is stabilized, and long-term storage stability is significantly excellent.

Further, in the case of the etching composition for a metal nitride layer of the present disclosure, an etch rate is not reduced even at a high temperature, an etch selectivity is also not reduced, and the etch rate and the etch selectivity may be easily controlled by adjusting the content of the boron-based compound.

Further, in the etching method of a metal nitride layer using the etching composition for a metal nitride layer of the present disclosure, the etching composition for a metal nitride layer of the present disclosure is used, such that an etch rate of the metal nitride layer is improved, and an etch rate of the metal layer is controlled. Therefore, an etch selectivity may be controlled, and etching properties may be improved.

Further, in the etching method of a metal nitride layer using the etching composition for a metal nitride layer of the present disclosure, etching may be performed even at a high temperature, and storage stability is excellent, such that an etch rate and an etch selectivity are maintained even after long-term storage after preparation of the etching composition.

That is, the etching composition for a metal nitride layer of the present disclosure may prevent a content change and an etching performance change of hydrogen peroxide due to decomposition of the hydrogen peroxide and may have significantly excellent storage stability, such that excellent etching properties may be maintained.

Therefore, in the case of the method of manufacturing a microelectronic device, the method including an etching process performed using the etching composition for a metal nitride layer of the present disclosure, productivity may be increased with excellent reliability.

It will be obvious to those skilled in the art to which the present disclosure pertains that the present disclosure is not limited to the above-mentioned exemplary embodiments and the accompanying drawings, but may be variously substituted, modified, and altered without departing from the scope and spirit of the present disclosure.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. An etching composition for a metal nitride layer comprising:
  sulfuric acid, hydrogen peroxide, a boron-based compound, and water, wherein the boron-based compound is contained in an amount of 0.0001 to 3 wt % with respect to a total weight of the etching composition, and wherein the boron-based compound is one or more selected from boron trioxide, sodium borate, sodium perborate tetrahydrate, magnesium perborate, triphenylboroxin, and a boron compound represented by the following Chemical Formula 1:

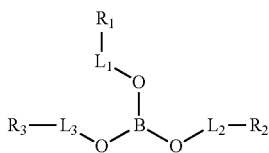

Chemical Formula 1 wherein $L_1$, $L_2$, and $L_3$ are each independently a single bond or $C_1$-$C_{10}$ alkylene; and $R_1$, $R_2$, and $R_3$ are each independently hydrogen, $C_1$-$C_{10}$ alkyl, $C_1$-$C_{10}$ haloalkyl, $C_6$-$C_{10}$ aryl, mono-$C_1$-$C_{10}$ alkylamino, di-$C_1$-$C_{10}$ alkylamino, mono-$C_6$-$C_{10}$ arylamino, or di-$C_6$-$C_{10}$ arylamino, and wherein the etching composition contains 75 to 95 wt % of sulfuric acid, 1 to 12 wt % of hydrogen peroxide, 0.0001 to 1 wt % of the boron-based compound, and a balance of water.

2. The etching composition of claim 1, wherein the boron-based compound is contained in an amount of 0.001 to 10 parts by weight with respect to 100 parts by weight of the hydrogen peroxide.

3. The etching composition of claim 1, further comprising one or two or more additional additives selected from an etching stabilizer, a fluorine-based compound, a glycol-based compound, and a pH adjuster.

4. The etching composition of claim 1, wherein the metal nitride layer is one or more selected from a titanium nitride layer, a tantalum nitride layer, and a titanium-tantalum nitride layer.

5. The etching composition of claim 4, wherein the metal nitride layer is obtained by laminating metal layers formed of one or two or more selected from tungsten, copper, molybdenum, titanium, indium, zinc, tin, and niobium.

6. An etching method of a metal nitride layer, comprising bringing the etching composition for a metal nitride layer of claim 1 into contact with a microelectronic device including a metal nitride layer and a metal layer to selectively etch the metal nitride layer from the microelectronic device.

7. The etching method of claim 6, wherein the metal nitride layer is one or more selected from a titanium nitride layer, a tantalum nitride layer, and a titanium-tantalum nitride layer.

8. The etching method of claim 6, wherein the metal layer is formed of one or two or more selected from tungsten, copper, molybdenum, titanium, indium, zinc, tin, and niobium.

9. A method of manufacturing a microelectronic device, the method comprising an etching process performed using the etching composition for a metal nitride layer of claim 1.

* * * * *